(12) United States Patent
Shu et al.

(10) Patent No.: US 8,945,815 B2
(45) Date of Patent: Feb. 3, 2015

(54) ALKALINE SOLUBLE RESIN AND LIGHT SENSIBLE RESIN COMPOSITION COMPRISING SAME AND USE THEREOF

(75) Inventors: Shi Shu, Beijing (CN); Chunmiao Zhou, Beijing (CN); Jianshe Xue, Beijing (CN); Jisheng Zhao, Beijing (CN); Xuelan Wang, Beijing (CN); Xiaoxiong Tian, Beijing (CN)

(73) Assignee: Boe Technology Group Co., Ltd., Beijing (CN)

(*) Notice: Subject to any disclaimer, the term of this patent is extended or adjusted under 35 U.S.C. 154(b) by 112 days.

(21) Appl. No.: 13/701,105

(22) PCT Filed: Jul. 13, 2012

(86) PCT No.: PCT/CN2012/078614
§ 371 (c)(1),
(2), (4) Date: Nov. 30, 2012

(87) PCT Pub. No.: WO2013/007214
PCT Pub. Date: Jan. 17, 2013

(65) Prior Publication Data
US 2013/0171566 A1    Jul. 4, 2013

(30) Foreign Application Priority Data
Jul. 14, 2011    (CN) .......................... 2011 1 0197275

(51) Int. Cl.
| | | |
|---|---|---|
| *G03F 7/075* | (2006.01) |
| *G03F 7/027* | (2006.01) |
| *C08F 30/08* | (2006.01) |
| *G03F 7/038* | (2006.01) |
| *C08F 2/38* | (2006.01) |
| *C08F 220/18* | (2006.01) |
| *C08F 290/06* | (2006.01) |
| *G02F 1/1335* | (2006.01) |
| *G02B 5/20* | (2006.01) |
| *C08F 283/12* | (2006.01) |
| *C08L 33/06* | (2006.01) |
| *G03F 7/00* | (2006.01) |
| *G03F 7/033* | (2006.01) |

(52) U.S. Cl.
CPC ............... *G03F 7/0384* (2013.01); *C08F 2/38* (2013.01); *C08F 220/18* (2013.01); *C08F 290/06* (2013.01); *G02F 1/1335* (2013.01); *G02B 5/20* (2013.01); *C08F 283/124* (2013.01); *C08L 33/064* (2013.01); *G03F 7/0007* (2013.01); *G03F 7/033* (2013.01); *G03F 7/0388* (2013.01); *G03F 7/0758* (2013.01)
USPC .................. 430/288.1; 430/281.1; 525/326.5

(58) Field of Classification Search
CPC ..... G03F 7/075; G03F 7/0757; G03F 7/0758; G03F 7/0388; C08F 236/00; C08F 267/00; C08F 267/02; C08F 267/06

USPC ............... 525/326.5; 430/281.1, 286.1, 287.1
See application file for complete search history.

(56) References Cited

U.S. PATENT DOCUMENTS

| | | | |
|---|---|---|---|
| 2005/0260523 | A1 | 11/2005 | Juan et al. |
| 2009/0042126 | A1 | 2/2009 | Tanaka et al. |
| 2010/0108357 | A1* | 5/2010 | Smedberg et al. ...... 174/120 SC |

FOREIGN PATENT DOCUMENTS

| | | | |
|---|---|---|---|
| CN | 1584638 | A | 2/2005 |
| CN | 1677138 | A | 10/2005 |
| CN | 1700094 | A | 11/2005 |
| CN | 101182366 | A | 5/2008 |
| CN | 101233452 | A | 7/2008 |
| CN | 101750887 | A * | 6/2010 |

(Continued)

OTHER PUBLICATIONS

Machine translation of JP 2010-229382, published on Oct. 14, 2010.*

(Continued)

*Primary Examiner* — Anca Eoff
(74) *Attorney, Agent, or Firm* — Ladas & Parry LLP

(57) ABSTRACT

An embodiment of the invention discloses an alkaline soluble resin and a method for preparing the same. The chemical formula of this alkaline soluble resin is shown in Formula I:

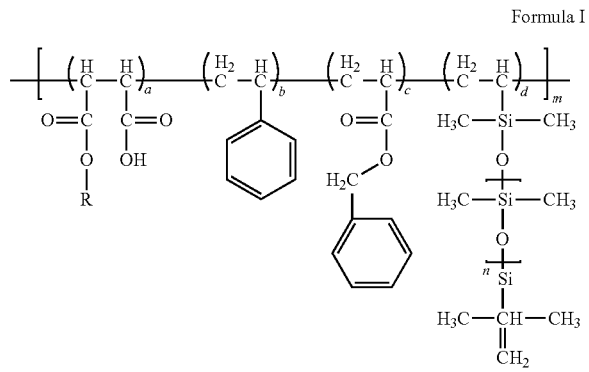

Formula I wherein a is an integer of 1 to 5, b is an integer of 1 to 5, c is an integer of 1 to 10, d is an integer of 1 to 10, m is an integer of 1 to 30, n is an integer of 1 to 10, R is hydrogen, alkyl, alkoxy or acrylate; the alkaline soluble resin has a weight-average molecular weight of 3,500-35,000. The invention also discloses a light sensible resin composition comprising the alkaline soluble resin, as well as a colored photoresist for color filters comprising the aforementioned light sensible resin composition and a display element comprising this colored photoresist.

20 Claims, No Drawings

(56) References Cited

FOREIGN PATENT DOCUMENTS

| JP | 2010-229382 | * | 10/2010 |
| WO | 2010/134549 A1 | | 11/2010 |

OTHER PUBLICATIONS

Carbon Black, Material Safety Data Sheet. Cabot Corporation, Dec. 4, 2012.*

English translation of CN 101750887A, published on Jun. 23, 2010.*

International Search Report mailed Nov. 1, 2012; PCT/CN2012/078614.

First Chinese Office Action; dated Sep. 4, 2013; Appln. No. 201110197275.5.

Second Chinese Office Action dated Mar. 7, 2014; Appln. No. 201110197275.5.

International Preliminary Report on Patentability dated Jan. 14, 2014; PCT/CN2012/078614.

* cited by examiner

ALKALINE SOLUBLE RESIN AND LIGHT SENSIBLE RESIN COMPOSITION COMPRISING SAME AND USE THEREOF

TECHNICAL FIELD

Embodiments of the invention relate to an alkaline soluble resin, a light sensible resin composition comprising the alkaline soluble resin, and use thereof.

BACKGROUND

Materials for preparing a color filter for a liquid crystal display are usually colored negative photoresist. A color filter is prepared in a process of coating the colored negative resists onto the surface of a glass substrate, followed by pre-bake, exposure, imaging and after-bake.

In order to achieve higher resolution and more colorful effect, the colored photoresist has to have a compact and level surface. However, during the preparation, surface defects such as orange peel, shrinkage, Bernard cells, etc., may occur on the surface due to multiple reasons, which cause the film not level and severely affect the display performance. The common treatment method against the above is the addition of a leveling agent.

In the meanwhile, to increase the imaging efficiency of the color filter, a higher amount of high viscosity alkaline soluble resin is often added into the formulation of its raw material, the colored photoresist. However, this renders the viscosity of the system too high, and limits the ability of the photoresist to self-level. If the content of the alkaline soluble resin is decreased, although the viscosity of the system can be reduced so as to improve the leveling, the adverse effect caused by remnants may occur.

To solve the above problem, it is required to improve the flexibility and the alkaline resistant (that is, crosslinking capacity) after the exposure of the chain segments of the alkaline soluble resin.

SUMMARY

The chemical structural formula of the alkaline soluble resin provided by an embodiment of the invention is shown in Formula I:

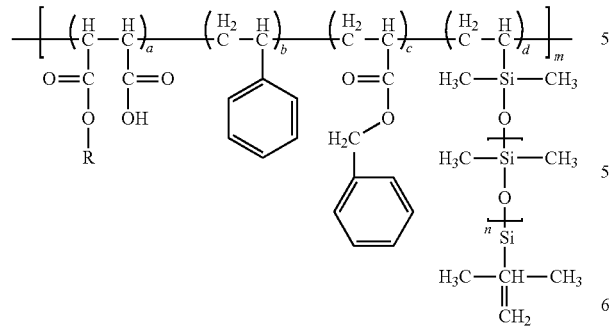

Formula I wherein a is an integer of 1 to 5, b is an integer of 1 to 5, c is an integer of 1 to 10, d is an integer of 1 to 10, m is an integer of 1 to 30, n is an integer of 1 to 10, R is hydrogen, alkyl, alkoxy or acrylate; and the alkaline soluble resin has a weight-average molecular weight of 3,500-35,000.

Another embodiment of the invention also provides the method for the preparation of the alkaline soluble resin, comprising the steps of: mixing an unsaturated anhydride or unsaturated carboxylic acid with styrene, benzyl acrylate, and an initiator; reacting at 60° C.-120° C. for 3~5 hours; agitating the reaction products at 70° C.-80° C. in an organic solvent, and adding dropwise polydimethylsiloxane with a vinyl terminal group during the agitation; after reacting for 2~3 hours, adjusting the temperature to 115° C.-125° C., and adding a chain transfer agent; agitating and refluxing the resultant mixture for a reaction of 7~8 hours, and then adding a thermal polymerization inhibitor for a reaction of 3~4 hours; and cooling to obtain the aforementioned alkaline soluble resin.

Another embodiment of the invention further provides a light sensible resin composition, comprising by weight the following components:

Component A: 1-500 parts, preferably 30-400 parts by weight of the alkaline soluble resin; and Component B: 10-500 parts, preferably 20-200 parts by weight of a light sensible polymer or monomer containing a vinyl or epoxy group.

Further another embodiment of the invention further provides a photoresist comprising any of the aforementioned light sensible resin composition.

Still further another embodiment of the invention further provides a color filter using the aforementioned light sensible resin as a raw material.

Still further another embodiment of the invention further provides a liquid crystal display device comprising the aforementioned color filter.

DETAILED DESCRIPTION

In order to more clearly demonstrate the purpose, technical solutions and advantages of the embodiments of the invention, the technical solutions of the embodiments in the invention are described below in a clear and complete manner. Apparently, the described embodiments are merely a portion of, rather than all of the embodiments of the invention. Any other embodiments obtained by a person skilled in the art based on the embodiments described herein without any creative labor fall into the scope of the invention.

The chemical structural formula of the alkaline soluble resin provided by an embodiment of the invention is shown in Formula I:

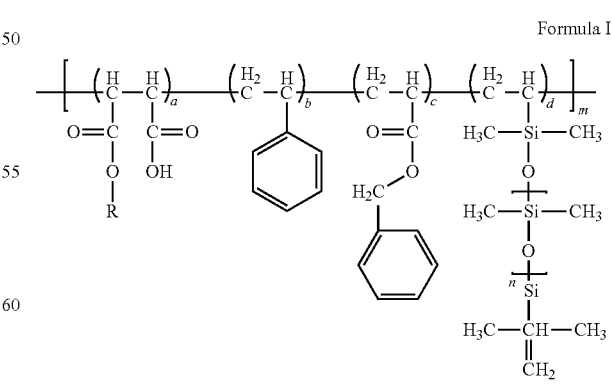

Formula I wherein a is an integer of 1 to 5, b is an integer of 1 to 5, c is an integer of 1 to 10, d is an integer of 1 to 10, m is an integer of 1 to 30, n is an integer of 1 to 10, R is hydrogen, alkyl, alkoxy or acrylate; and the alkaline soluble resin has a weight-average molecular weight of 3,500-35,000.

Another embodiment of the invention further provides the method for the preparation of the alkaline soluble resin, comprising the steps of: mixing an unsaturated anhydride or unsaturated carboxylic acid with styrene, benzyl acrylate, and an initiator; reacting at 60° C.-120° C. for 3~5 hours; agitating the reaction products at 70° C.-80° C. in an organic solvent, and adding dropwise polydimethylsiloxane with a vinyl terminal group at a rate of every 2-3 seconds during the agitation; after reacting for 2~3 hours, adjusting the temperature to 115° C.-125° C., and adding a chain transfer agent; agitating and refluxing the resultant mixture for a reaction of 7~8 hours, and then adding a thermal polymerization inhibitor for a reaction of 3~4 hours; and cooling to obtain the aforementioned alkaline soluble resin.

The alkaline soluble resin prepared by the aforementioned method is a copolymer of an unsaturated anhydride or unsaturated carboxylic acid, styrene, acrylate, and polydimethylsiloxane with a vinyl terminal group, and/or a derivative thereof.

For example, the unsaturated anhydride or unsaturated carboxylic acid, styrene, benzyl acrylate, initiator, organic solvent, polydimethylsiloxane with a vinyl terminal group, chain transfer agent, and thermal polymerization inhibitor have a weight ratio of 10-30:30-50:10-35:6-8:140-160:5-13:2-4:0.04-0.06.

For example, the unsaturated anhydride or unsaturated carboxylic acid, styrene, benzyl acrylate, initiator, organic solvent, polydimethylsiloxane with a vinyl terminal group, chain transfer agent, and thermal polymerization inhibitor have a weight ratio of 15-30:30-45:20-35:6.8-8:145-155:12-13:2-3:0.04-0.05.

In one example, the unsaturated anhydride or unsaturated carboxylic acid, styrene, benzyl acrylate, initiator, organic solvent, polydimethylsiloxane with a vinyl terminal group, chain transfer agent, and thermal polymerization inhibitor have a weight ratio of 30:30:35:8:150:12:3:0.05.

For example, the unsaturated anhydride or unsaturated carboxylic acid is preferably maleic anhydride; the initiator is preferably AIBN (Azo-bis-isobutryonitrile, azobisisobutyronitrile) and/or BPO (benzoyl peroxide); the organic solvent is preferably propylene glycol monoethyl ether, cyclohexane, ethylene glycol monoethyl ether, or diethylene glycol diethyl ether ethyl acetate; the chain transfer agent is 2-hydroxy-1-ethanethiol; and the thermal polymerization inhibitor is preferably methoxyhydroquinone.

Another embodiment of the invention further provides a light sensible resin composition, comprising by weight the following components:

Component A: 1-500 parts, preferably 30-400 parts by weight of the alkaline soluble resin; and Component B: 10-500 parts, preferably 20-200 parts by weight of a light sensible polymer or monomer containing a vinyl or epoxy group.

In another embodiment of the invention, the light sensible resin composition may further comprise by weight the following components:

Component C: 60-150 parts, preferably 80-120 parts by weight of a pigment;

Component D: 5-200 parts, preferably 30-120 parts by weight of a dispersant;

Component E: 1-200 parts, preferably 5-70 parts by weight of a light initiator;

Component F: 200-3000 parts, preferably 300-2000 parts by weight of a solvent; and Component G: 1-17 parts, preferably 5-25 by weight of an adjuvant.

The aforementioned components are thoroughly mixed according to the ratio to provide the light sensible resin composition. The viscosity of Component A the alkaline soluble resin is the viscosity of the light sensible resin composition.

For example, the light sensible resin composition comprises 1-500 parts by weight of Component A, 10-500 parts by weight of Component B, 60-150 parts by weight of Component C, 5-200 parts by weight of Component D, 1-200 parts by weight of Component E, 200-3000 parts by weight of Component F, and 1-17 parts by weight of Component G.

For example, the light sensible resin composition comprises 30-400 parts by weight of Component A, 20-200 parts by weight of Component B, 80-120 parts by weight of Component C, 30-120 parts by weight of Component D, 5-70 parts by weight of Component E, 300-2000 parts by weight of Component F, and 5-15 parts by weight of Component G.

For example, the light sensible resin composition comprises 100-370 parts by weight of Component A, 100-150 parts by weight of Component B, 100-120 parts by weight of Component C, 100-120 parts by weight of Component D, 14-23 parts by weight of Component E, 740-850 parts by weight of Component F, and 2-4 parts by weight of Component G.

In one example, the light sensible resin composition comprises 100 parts by weight of Component A, 100 parts by weight of Component B, 100 parts by weight of Component C, 100 parts by weight of Component D, 14 parts by weight of Component E, 800 parts by weight of Component F, and 3 parts by weight of Component G.

For example, the Component B is selected from one or more of a monofunctional or multifunctional acrylate, epoxy acrylate, polyurethane acrylate, polyester acrylate and acrylated polyacrylate.

For example, the Component C is selected from a red pigment, a yellow pigment, an orange pigment, a blue pigment, a green pigment and/or a black pigment.

For example, the red pigment is selected from P.R.122, P.R.123, P.R.177, P.R.179, P.R.190, P.R.202, P.R.210, P.R.224, P.R.254, P.R.255, P.R.264, P.R.270, P.R.272 and/or P.R.122;

For example, the yellow pigment is selected from P.Y.1, P.Y.12, P.Y.3, P.Y.13, P.Y.83, P.Y.93, P.Y.94, P.Y.95, P.Y.109, P.Y.126, P.Y.127, P.Y.138, P.Y.139, P.Y.139, P.Y.147, P.Y.150, P.Y.174 and/or P.Y.180;

For example, the orange pigment is selected from P.O.5, P.O.13, P.O.16, P.O.34, P.O.36, P.O.48, P.O.49, P.O.71 and/or P.O.73;

For example, the blue pigment is selected from for example phthalocyanine blue, indanthrene blue and/or C.I. Pigment Blue;

For example, the green pigment is selected from C.I. Pigment Green 2, C.I. Pigment Green 8 and/or C.I. Pigment Green 10;

For example, the black pigment is selected from one or more of Monarch® 430, Monarch® 460, Monarch® 800, Monarch® 1300, Monarch® 900, Monarch® 717, Monarch® 5701, REGAL® 660R, REGAL® 400R, REGAL® 330R, REGAL® 99R, REGAL® 415, REGAL® 415R, REGAL® 250, REGAL® 250R, REGAL® 330, BLACK PEARLS® 480, BLACK PEARLS® 130, Special Black® 4, Special Black® 250, Special Black® 350, Special Black® 100, Printex® 90, Printex® 95, Printex® 85, Printex® 75, Printex® 55, Printex® 30, Printex® 40, Printex® 45, Printex® 3, Printex® A, Printex® G, MA7, MA8, MA11, MA100, MA220, MA230, #50, #52, #45, #47, #2700; #2650, #2200, #1000, #990 and #900.

For example, the Component D is selected from one or more of amide polymers, modified polyurethane polymers and high molecular block polymers containing a pigment affinity group, such as BYK-110, BYK-170, BYK-171, BYK-176 (BYK Chemical).

For example, the Component E can be a free radical light initiator, or a cationic light initiator, or mixture thereof. An example of the light initiator is selected from one or more compounds including, but not limited to, benzoyl light polymerization initiators such as benzoyl, benzoyl methyl ether, benzoyl ethyl ether, benzoyl isopropyl ether and/or benzoyl iso-butyl ether and like; radical initiators such as 2,4,6-trimethyl benzoyl diphenyl phosphine oxide, 2,2'-bis(O-chlorophenyl)-4,4',5,5'-tetraphenyl-1,2'-biimidazole, 2-ethyl anthraquinone, benzil, camphorquinone and/or methyl phenylglyoxylate and like; acid generating agents such as 4-hydroxyphenyl dimethyl sulfonium p-toluene sulfonate, triphenyl sulfonium hexafluoroantimonate, diphenyl iodonium hexafluoroantimonate, benzoyl toluene sulfonate and like; acetylphenol compounds such as 2-hydroxy-2-methyl-1-phenylpropan-1-one, diethoxyacetylphenol, 2-methyl-2-morpholino-1-(4-methyl-phenylthio)butanone and/or 2-hydroxy-2-methyl-1-[4-(methylvinyl)phenyl]propan-1-one; and triazine compounds such as 2,4-bis(trichloromethyl)-6-(4-methoxyphenyl)-1,3,5-triazine, 2,4-bis(trichloromethyl)-6-piperonyl-1,3,5-triazine and/or 2,4-bis(trichloromethyl)-6-[2-(5-methylfuran)-vinyl]-1,3,5-triazine.

For example, the Component E is selected from one or more of 2-methyl-2-morpholino-1-(4-methyl-phenylthio)butanone, 2,4-bis(trichloromethyl)-6-(4-methoxyphenyl)-1,3, 5-triazine, and 2-phenylbenzyl-2-dimethyl amine-1-(4-morpholinylbenzylphenyl)butanone.

For example, the Component F is selected from one or more of formic acid, acetic acid, chloroform, acetone, butanone, aliphatic alcohols, ethylene glycol monomethyl ether, ethylene glycol monomethyl ether, ethylene glycol monompropyl ether, ethylene glycol monobutyl ether, diethylene glycol diethyl ether acetate, methyl ethyl ketone, methyl isobutyl ketone, ethylene glycol monomethyl ether, γ-butyrolactone, ethyl 3-ethoxypropinate, butyl carbitol, butyl carbitol acetate, propylene glycol monomethyl ether, propylene glycol monomethyl ether acetate, cyclohexane, xylene and isopropanol For example, the Component G is selected from one or more of an adhesion promoter, antioxidant, UV absorbent, deflocculating agent and leveling agent. Component G is preferably a silane coupling agent.

The alkaline soluble resin of the embodiments of the invention is a copolymer comprising vinyl polydimethylsilane side chains. A colored photoresist formed from a light sensible resin composition comprising this alkaline soluble resin has the advantage of level surface of the coating.

The Component A, the alkaline soluble resin (a copolymer of an unsaturated anhydride or unsaturated carboxylic acid, styrene, acrylate, and polydimethylsiloxane with a vinyl terminal group, and/or a derivative thereof) in the light sensible resin composition provided in the embodiments of the invention has highly flexible and low surface energy polysiloxane chain segments in its side chains, which can significantly decrease the viscosity of the system, and reduces the segment difference between the overlapping part of the colored photoresist and the black matrix. Moreover, the low surface energy polysiloxane chain segment can increase the levelness of the coating, and eliminate the surface defects such as orange peel, shrinkage and Benard cells, etc. Moreover, the vinyl group on the polysiloxane side chains can graft the alkaline soluble resin in the exposed area to the light sensible resin, so as to greatly increase the alkaline resistance, and ensure the levelness and smoothness of the surface of the colored photoresist.

The light sensible resin composition of the embodiments of the invention has moderate viscosity and good leveling ability. It can be used for a colored photoresist so that the layer of the photoresist is level and compact, and the display performance of the liquid crystal display comprising such a photoresist is improved.

Example 1

The light sensible resin composition of this example comprises the following components:

100 parts by weight of the alkaline soluble resin, 100 parts by weight of an epoxy acrylate polymer, 100 parts by weight of the pigment P.R.179, 100 parts by weight of BYK-110 as a dispersant, 14 parts by weight of benzoyl isopropyl ether as a light initiator, 800 parts by weight of propylene glycol monoethyl ether, and 3 parts by weight of a silane coupling agent.

All components are thoroughly mixed to obtain the light sensible resin composition. The method for preparing the alkaline soluble resin is as follows:

30 g maleic anhydride, 30 g styrene, 35 g benzyl acrylate, and 8 g initiator AIBN are mixed and reacted at 60° C. for 4 h. The reaction product is subject to agitation and reflux in 150 g propylene glycol monoethyl ether solvent at 75° C., and 12 g polydimethylsiloxane with a vinyl terminal group is added dropwise at a rate of every 2-3 seconds during the agitation. After automatically reacting for 2 hours, the temperature is adjusted to 120° C., and 3 g 2-hydroxy-1-ethanethiol is added as the chain transfer agent. The resultant mixture is agitated and refluxed for a reaction of 7 hours. 0.05 g methoxyhydroquinone is added to the reactant as the thermal polymerization inhibitor for a reaction of 3 hours. After cooling, a viscous alkaline soluble resin is obtained.

The resultant alkaline soluble resin has a structure as shown in Formula I:

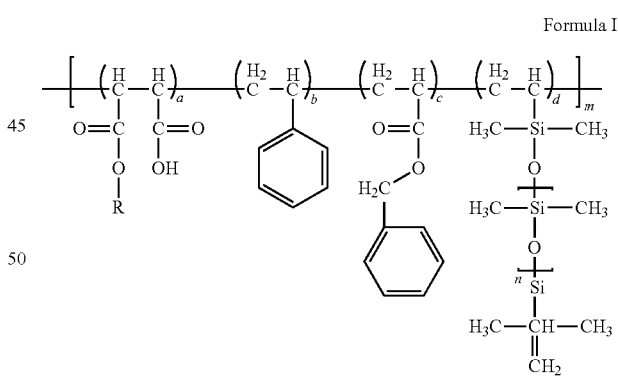

Formula I wherein a is an integer of 1 to 2, b is an integer of 1 to 2, c is an integer of 1 to 5, d is 1, m is an integer of 25 to 30, n is an integer of 5 to 10, R is hydrogen, alkyl, alkoxy or acrylate; and the resultant alkaline soluble resin has a weight-average molecular weight of 5,000-30,000 and a viscosity of 9.2 cp.

Example 2

The light sensible resin composition of this example comprises the following components:

150 parts by weight of the alkaline soluble resin, 100 parts by weight of a polyurethane acrylate polymer, 100 parts by weight of the phthalocyanine blue, 100 parts by weight of BYK-170 as a dispersant, 14 parts by weight of benzoyl isopropyl ether as a light initiator, 740 parts by weight of cyclohexane, and 3 parts by weight of a silane coupling agent.

All components are thoroughly mixed to obtain the light sensible resin composition. The method for preparing the alkaline soluble resin is as follows:

10 g maleic anhydride, 45 g styrene, 20 g benzyl acrylate, and 8 g initiator BPO are mixed and reacted at 90° C. for 4 h. The reaction product is subject to agitation and reflux in 150 g cyclohexane solvent at 70° C., and 13 g polydimethylsiloxane with a vinyl terminal group is added dropwise at a rate of every 2-3 seconds during the agitation. After automatically reacting for 2 hours, the temperature is adjusted to 115, and 3 g 2-hydroxy-1-ethanethiol is added as the chain transfer agent. The resultant mixture is agitated and refluxed for a reaction of 7 hours. 0.05 g methoxyhydroquinone is added to the reactant as the thermal polymerization inhibitor for a reaction of 3 hours. After cooling, a viscous alkaline soluble resin is obtained.

The resultant alkaline soluble resin has a structure as shown in Formula I, wherein a is 1, b is an integer of 4 to 5, c is an integer of 1 to 2, d is an integer of 1 to 2, m is an integer of 1 to 30, n is an integer of 5 to 10, R is hydrogen, alkyl, alkoxy or acrylate; and the resultant alkaline soluble resin has a weight-average molecular weight of 5,000-35,000 and a viscosity of 9.7 cp.

Example 3

The light sensible resin composition of this example comprises the following components:

370 parts by weight of the alkaline soluble resin, 120 parts by weight of pentaerythritol tetraacrylate, 100 parts by weight of the pigment C.I. Pigment Green, 100 parts by weight of BYK-171 as a dispersant, 20 parts by weight of benzoyl isopropyl ether as a light initiator, 850 parts by weight of ethylene glycol monoethyl ether, and 3 parts by weight of a silane coupling agent.

All components are thoroughly mixed to obtain the light sensible resin composition. The method for preparing the alkaline soluble resin is as follows:

10 g maleic anhydride, 45 g styrene, 20 g benzyl acrylate, and 6.8 g initiator BPO are mixed and reacted at 60° C. for 5 h. The reaction product is subject to agitation and reflux in 150 g ethylene glycol monethyl ether solvent at 75° C., and 12 g polydimethylsiloxane with a vinyl terminal group is added dropwise at a rate of every 2-3 seconds during the agitation. After automatically reacting for 2 hours, the temperature is adjusted to 115° C., and 3 g 2-hydroxy-1-ethanethiol is added as the chain transfer agent. The resultant mixture is agitated and refluxed for a reaction of 7 hours. 0.05 g methoxyhydroquinone is added to the reactant as the thermal polymerization inhibitor for a reaction of 3 hours. After cooling, a viscous alkaline soluble resin is obtained.

The resultant alkaline soluble resin has a structure as shown in Formula I, wherein a is 1, b is an integer of 4 to 5, c is an integer of 1 to 2, d is an integer of 1 to 2, m is an integer of 1 to 30, n is an integer of 5 to 10, R is hydrogen, alkyl, alkoxy or acrylate; and the resultant alkaline soluble resin has a weight-average molecular weight of 5,000-35,000 and a viscosity of 9.3 cp.

Example 4

The light sensible resin composition of this example comprises the following components:

350 parts by weight of the alkaline soluble resin, 120 parts by weight of pentaerythritol tetraacrylate, 100 parts by weight of the yellow pigment P.Y.83, 100 parts by weight of BYK-170 as a dispersant, 20 parts by weight of benzoyl isopropyl ether as a light initiator, 850 parts by weight of ethylene glycol monoethyl ether, and 3 parts by weight of a silane coupling agent.

All components are thoroughly mixed to obtain the light sensible resin composition. The method for preparing the alkaline soluble resin is as follows:

15 g maleic anhydride, 50 g styrene, 10 g benzyl acrylate, and 8 g initiator BPO are mixed and reacted at 120° C. for 3 h. The reaction product is subject to agitation and reflux in 150 g ethylene glycol monethyl ether solvent at 80° C., and 12 g polydimethylsiloxane with a vinyl terminal group is added dropwise at a rate of every 2-3 seconds during the agitation. After automatically reacting for 2 hours, the temperature is adjusted to 125° C., and 3 g 2-hydroxy-1-ethanethiol is added as the chain transfer agent. The resultant mixture is agitated and refluxed for a reaction of 7 hours. 0.05 g methoxyhydroquinone is added to the reactant as the thermal polymerization inhibitor for a reaction of 3 hours. After cooling, a viscous alkaline soluble resin is obtained.

The resultant alkaline soluble resin has a structure as shown in Formula I, wherein a is an integer of 1 to 2, b is an integer of 3 to 5, c is 1, d is an integer of 1 to 2, m is an integer of 1 to 30, n is an integer of 1 to 5, R is hydrogen, alkyl, alkoxy or acrylate; and the resultant alkaline soluble resin has a weight-average molecular weight of 3,500-20,000 and a viscosity of 9.1 cp.

Example 5

The light sensible resin composition of this example comprises the following components:

330 parts by weight of the alkaline soluble resin, 100 parts by weight of pentaerythritol tetraacrylate, 100 parts by weight of the orange pigment P.O.5, 100 parts by weight of BYK-176 as a dispersant, 20 parts by weight of benzoyl isopropyl ether as a light initiator, 850 parts by weight of cyclohexane, and 3 parts by weight of a silane coupling agent.

All components are thoroughly mixed to obtain the light sensible resin composition. The method for preparing the alkaline soluble resin is as follows:

15 g maleic anhydride, 50 g styrene, 30 g benzyl acrylate, and 3 g initiator AIBN are mixed and reacted at 80° C. for 3 h. The reaction product is subject to agitation and reflux in 150 g cyclohexane solvent at 75° C., and 12 g polydimethylsiloxane with a vinyl terminal group is added dropwise at a rate of every 2-3 seconds during the agitation. After automatically reacting for 2 hours, the temperature is adjusted to 125° C., and 3 g 2-hydroxy-1-ethanethiol is added as the chain transfer agent. The resultant mixture is agitated and refluxed for a reaction of 7 hours. 0.05 g methoxyhydroquinone is added to the reactant as the thermal polymerization inhibitor for a reaction of 3 hours. After cooling, a viscous alkaline soluble resin is obtained.

The resultant alkaline soluble resin has a structure as shown in Formula I, wherein a is an integer of 1 to 2, b is an integer of 3 to 5, c is an integer of 2 to 4, d is an integer of 1 to 2, m is an integer of 1 to 30, n is an integer of 1 to 10, R is hydrogen, alkyl, alkoxy or acrylate; and the resultant alkaline soluble resin has a weight-average molecular weight of 3,500-35,000 and a viscosity of 8.9 cp.

Example 6

The light sensible resin composition of this example comprises the following components:

330 parts by weight of the alkaline soluble resin, 120 parts by weight of pentaerythritol tetraacrylate, 120 parts by weight of the black pigment Special Black 250, 120 parts by weight of BYK-110 as a dispersant, 20 parts by weight of benzoyl isopropyl ether as a light initiator, 850 parts by weight of diethylene glycol diethyl ether ethyl acetate, and 3 parts by weight of a silane coupling agent.

All components are thoroughly mixed to obtain the light sensible resin composition. The method for preparing the alkaline soluble resin is as follows:

15 g maleic anhydride, 50 g styrene, 30 g benzyl acrylate, and 3 g initiator AIBN are mixed and reacted at 100° C. for 4 h. The reaction product is subject to agitation and reflux in 150 g diethylene glycol diethyl ether ethyl acetate solvent at 70° C., and 12 g polydimethylsiloxane with a vinyl terminal group is added dropwise at a rate of every 2-3 seconds during the agitation. After automatically reacting for 2 hours, the temperature is adjusted to 125° C., and 3 g 2-hydroxy-1-ethanethiol is added as the chain transfer agent. The resultant mixture is agitated and refluxed for a reaction of 7 hours. 0.05 g methoxyhydroquinone is added to the reactant as the thermal polymerization inhibitor for a reaction of 3 hours. After cooling, a viscous alkaline soluble resin is obtained.

The resultant alkaline soluble resin has a structure as shown in Formula I, wherein a is an integer of 1 to 2, b is an integer of 3 to 5, c is an integer of 2 to 4, d is an integer of 1 to 2, m is an integer of 1 to 30, n is an integer of 1 to 10, R is hydrogen, alkyl, alkoxy or acrylate; and the resultant alkaline soluble resin has a weight-average molecular weight of 3,500-35,000 and a viscosity of 8.8 cp.

Example 7

The light sensible resin composition of this example comprises the following components:

370 parts by weight of the alkaline soluble resin, 150 parts by weight of pentaerythritol tetraacrylate, 100 parts by weight of the red pigment P.R.179, 100 parts by weight of BYK-171 as a dispersant, 23 parts by weight of benzoyl isopropyl ether as a light initiator, 800 parts by weight of ethylene glycol monoethyl ether, and 3 parts by weight of a silane coupling agent.

All components are thoroughly mixed to obtain the light sensible resin composition. The method for preparing the alkaline soluble resin is as follows:

10 g maleic anhydride, 45 g styrene, 20 g benzyl acrylate, and 6.8 g initiator BPO are mixed and reacted at 120° C. for 3 h. The reaction product is subject to agitation and reflux in 150 g ethylene glycol monoethyl ether solvent at 75, and 12 g polydimethylsiloxane with a vinyl terminal group is added dropwise at a rate of every 2-3 seconds during the agitation. After automatically reacting for 2 hours, the temperature is adjusted to 120° C., and 3 g 2-hydroxy-1-ethanethiol is added as the chain transfer agent. The resultant mixture is agitated and refluxed for a reaction of 7 hours. 0.05 g methoxyhydroquinone is added to the reactant as the thermal polymerization inhibitor for a reaction of 3 hours. After cooling, a viscous alkaline soluble resin is obtained.

The resultant alkaline soluble resin has a structure as shown in Formula I, wherein a is 1, b is an integer of 4 to 5, c is an integer of 1 to 2, d is an integer of 1 to 2, m is an integer of 1 to 30, n is an integer of 5 to 10, R is hydrogen, alkyl, alkoxy or acrylate; and the resultant alkaline soluble resin has a weight-average molecular weight of 3,500-35,000 and a viscosity of 9.1 cp.

Comparative Example 1

370 parts by weight of a copolymer of styrene and maleic anhydride, 120 parts by weight of pentaerythritol tetraacrylate, 100 parts by weight of the pigment C.I. Pigment Green, 100 parts by weight of BYK-110 as the dispersant, 20 parts by weight of benzoyl isopropyl ether as the light initiator, 850 parts by weight of ethylene glycol monoethyl ether, and 3 parts by weight of a silane coupling agent. The aforementioned components are thoroughly mixed to obtain a light sensible resin composition having a viscosity of 13.2 cp.

Comparative Example 2

350 parts by weight of a copolymer of styrene and maleic anhydride, 120 parts by weight of pentaerythritol tetraacrylate, 100 parts by weight of the yellow pigment P.Y.83, 100 parts by weight of BYK-171 as the dispersant, 20 parts by weight of benzoyl isopropyl ether as the light initiator, 350 parts by weight of ethylene glycol monoethyl ether, and 3 parts by weight of a silane coupling agent. The aforementioned components are thoroughly mixed to obtain a light sensible resin composition having a viscosity of 12.9 cp.

Comparison Result 1

The light sensible resin compositions obtained in Examples 1-7 and the light sensible resin compositions obtained in Comparative Example 1 and are both spin coated at 600 rpm to films, and developed for 25 second in a 1 wt % potassium hydroxide solution to compare the imaging performance. The results are shown in Table 1.

TABLE 1

| | Imaging results | | |
|---|---|---|---|
| | Surface of Film | Completeness of Development | Edge Conditions |
| Example 1 | Smooth | Yes | Neat |
| Example 2 | Smooth | Yes | Neat |
| Example 3 | Smooth | Yes | Neat |
| Example 4 | Smooth | Yes | Neat |
| Example 5 | Smooth | Yes | Neat |
| Example 6 | Smooth | Yes | Neat |
| Example 7 | Smooth | Yes | Neat |
| Comparative Example 1 | Rough | No | Burr |
| Comparative Example 2 | Rough | No | Burr |

As can be seen from the above experiment, the light sensible resin compositions in the embodiments of the invention have moderate viscosity between 8.8 and 9.8 cp and good leveling. The surface of the film is smooth. The development is complete. The edges are neat. Therefore, they are suitable for the colored photoresist for color filter.

Comparison Result 2

The light sensible compositions of Examples 1-7 and Comparative Examples 1 and 2 are used as colored photoresist, which is used as a raw material to prepare a color filter, and the color filter is used to prepare a corresponding liquid crystal display, and the performances is compared. The results show that the liquid crystal display made from the embodiments of the invention do not have defective pixels, and the liquid crystal display made from the comparative examples have many defective pixels.

Although the invention has been illustrated generally and by specific embodiments as mentioned above, it is apparent to a person skilled in the art that modifications or improvements may be made on the basis of the invention. Therefore, all these modifications or improvements not departing from the spirit of the invention are encompassed in the scope of the invention.

The invention claimed is:
1. An alkaline soluble resin, a chemical structural formula of which is shown in Formula I:

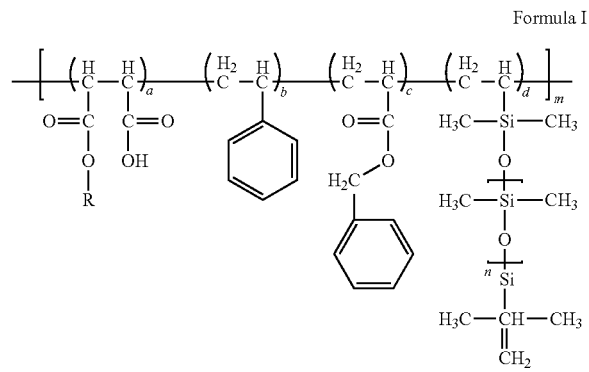

Formula I wherein a is an integer of 1 to 5, b is an integer of 1 to 5, c is an integer of 1 to 10, d is an integer of 1 to 10, m is an integer of 1 to 30, n is an integer of 1 to 10, and R is hydrogen, alkyl, alkoxy or acrylate; and
the alkaline soluble resin has a weight-average molecular weight of 3,500-35,000.

2. A method for the preparation of the alkaline soluble resin according to claim 1, comprising steps of:
mixing an unsaturated anhydride or unsaturated carboxylic acid with styrene, benzyl acrylate, and an initiator, and reacting at 60° C.-120° C. for 3 to 5 hours
agitating and refluxing the reaction product at 70° C.-80° C. in an organic solvent, and adding dropwise polydimethylsiloxane with a vinyl terminal group during the agitation;
after reacting for 2 to 3 hours, adjusting temperature to 115° C.-125° C., and adding a chain transfer agent;
agitating and refluxing the resultant mixture for a reaction of 7 to 8 hours, and then adding a thermal polymerization inhibitor for a reaction of 3 to 4 hours; and
cooling to obtain the alkaline soluble resin.

3. The method according to claim 2, wherein the unsaturated anhydride or unsaturated carboxylic acid, styrene, benzyl acrylate, initiator, organic solvent, polydimethylsiloxane with a vinyl terminal group, chain transfer agent, and the thermal polymerization inhibitor have a weight ratio of 10-30:30-50:10-35:6-8:140-160:5-13:2-4:0.04-0.06.

4. The method according to claim 3, wherein the unsaturated anhydride or unsaturated carboxylic acid, styrene, benzyl acrylate, initiator, organic solvent, polydimethylsiloxane with a vinyl terminal group, chain transfer agent, and thermal polymerization inhibitor have a weight ratio of 15-30:30-45:20-35:6.8-8:145-155:12-13:2-3:0.04-0.05.

5. The method according to claim 2, wherein the unsaturated anhydride is maleic anhydride.

6. The method according to claim 2, wherein the initiator is azobisisobutyronitrile and/or benzoyl peroxide.

7. The method according to claim 2, wherein the organic solvent is selected from one of propylene glycol monoethyl ether, cyclohexane, ethylene glycol monoethyl ether, and diethylene glycol diethyl ether ethyl acetate.

8. The method according to claim 2, wherein the chain transfer agent is 2-hydroxy-1-ethanethiol.

9. The method according to claim 2, wherein the thermal polymerization inhibitor is methoxyhydroquinone.

10. The method according to claim 2, wherein polydimethylsiloxane with a vinyl terminal group is added at a rate of every 2-3 seconds during the agitation.

11. A light sensible resin composition, comprising by weight following components:
Component A: 1-500 parts by weight of the alkaline soluble resin according to claim 1; and
Component B: 10-500 parts by weight of a light sensible polymer or monomer containing a vinyl or epoxy group.

12. The light sensible resin composition according to claim 11, further comprising by weight the following components:
Component C: 60-150 parts by weight of a pigment;
Component D: 5-200 parts by weight of a dispersant;
Component E: 1-200 parts by weight of a light initiator;
Component F: 200-3000 parts by weight of a solvent; and
Component G: 1-17 parts by weight of an adjuvant.

13. The light sensible resin composition according to claim 12, wherein the light sensible resin composition comprises 30-400 parts by weight of Component A, 20-200 parts by weight of Component B, 80-120 parts by weight of Component C, 30-120 parts by weight of Component D, 5-70 parts by weight of Component E, 300-2000 parts by weight of Component F, and 5-15 parts by weight of Component G.

14. The light sensible resin composition according to claim 13, wherein the light sensible resin composition comprises 100-370 parts by weight of Component A, 100-150 parts by weight of Component B, 100-120 parts by weight of Component C, 100-120 parts by weight of Component D, 14-23 parts by weight of Component E, 740-850 parts by weight of Component F, and 2-4 parts by weight of Component G.

15. The light sensible resin composition according to claim 12, wherein the Component C is selected from one or more of a red pigment, a yellow pigment, an orange pigment, a blue pigment, a green pigment and a black pigment; and
wherein the red pigment is selected from one or more of P.R.122, P.R.123, P.R.177, P.R.179, P.R.190, P.R.202, P.R.210, P.R.224, P.R.254, P.R.255, P.R.264, P.R.270, P.R.272 and P.R.122;
the yellow pigment is selected from one or more of P.Y.1, P.Y.12, P.Y.3, P.Y.13, P.Y.83, P.Y.93, P.Y.94, P.Y.95, P.Y.109, P.Y.126, P.Y.127, P.Y.138, P.Y.139, P.Y.139, P.Y.147, P.Y.150, P.Y.174 and P.Y.180;
the orange pigment is selected from one or more of P.O.5, P.O.13, P.O.16, P.O.34, P.O.36, P.O.48, P.O.49, P.O.71 and P.O.73;
the blue pigment is selected from for embodiment one or more of phthalocyanine blue, indanthrene blue and C.I. Pigment Blue;
the green pigment is selected from one or more of C.I. Pigment Green 2, C.I. Pigment Green 8 and C.I. Pigment Green 10; and
the black pigment comprises carbon black.

16. The light sensible resin composition according to claim 12, wherein the Component D is selected from one or more of amide polymers, modified polyurethane polymers, and high molecular block polymers containing a pigment affinity group.

17. The light sensible resin composition according to claim 12, wherein the Component E is selected from one or more of benzoyl, benzoyl methyl ether, benzoyl ethyl ether, benzoyl isopropyl ether, benzoyl iso-butyl ether, 2,4,6-trimethyl benzoyl diphenyl phosphine oxide, 2,2'-bis(O-chlorophenyl)-4, 4',5,5'-tetraphenyl-1,2'-biimidazole, 2-ethyl anthraquinone, benzil, camphorquinone, methyl phenylglyoxylate, 4-hydroxyphenyl dimethyl sulfonium p-toluene sulfonate, triphenyl sulfonium hexafluoroantimonate, diphenyl iodonium hexafluoroantimonate, benzoyl toluene sulfonate, 2-hydroxy-2-methyl-1-phenylpropyl-1-one, diethoxyacetylphenol, 2-methyl-2-morpholino-1-(4-methyl-phenylthio)butanone, 2-hydroxy-2-methyl-1-[4-(methylvinyl)phenyl]propan-1-one, 2,4-bis(trichloromethyl)-6-(4-methoxyphenyl)-1,3,5-triazine, 2,4-bis(trichloromethyl)-6-piperonyl-1,3,5-triazine, and 2,4-bis(trichloromethyl)-6-[2-(5-methylfuran)-vinyl]-1,3,5-triazine.

18. The light sensible resin composition according to claim 12, wherein the Component F is selected from one or more of formic acid, acetic acid, chloroform, acetone, butanone, aliphatic alcohols, ethylene glycol monomethyl ether, ethylene glycol monomethyl ether, ethylene glycol monompropyl ether, ethylene glycol monobutyl ether, diethylene glycol diethyl ether acetate, methyl ethyl ketone, methyl isobutyl ketone, ethylene glycol monomethyl ether, γ-butyrolactone, ethyl 3-ethoxypropinate, butyl carbitol, butyl carbitol acetate, propylene glycol monomethyl ether, propylene glycol monomethyl ether acetate, cyclohexane, xylene and isopropanol.

19. The light sensible resin composition according to claim 12, where the Component G is selected from one or more of an adhesion promoter, antioxidant, UV absorbent, deflocculating agent and leveling agent.

20. The light sensible resin composition according to claim 1 wherein the Component B is selected from one or more of monofunctional or multifunctional acrylate, epoxy acrylate, polyurethane acrylate, polyester acrylate and acrylated polyacrylate.

* * * * *